US012584977B2

(12) United States Patent
Montoya et al.

(10) Patent No.: US 12,584,977 B2
(45) Date of Patent: Mar. 24, 2026

(54) MAGNETIC FIELD DETECTOR

(71) Applicant: Naval Information Warfare Center Pacific, San Diego, CA (US)

(72) Inventors: Sergio A Montoya, Chula Vista, CA (US); Benjamin J Taylor, Escondido, CA (US)

(73) Assignee: The United States of America, as Represented by the Secretary of the Navy, Washington, DC (US)

( * ) Notice: Subject to any disclaimer, the term of this patent is extended or adjusted under 35 U.S.C. 154(b) by 257 days.

(21) Appl. No.: 18/194,968

(22) Filed: Apr. 3, 2023

(65) Prior Publication Data

US 2024/0329161 A1     Oct. 3, 2024

(51) Int. Cl.
_G01R 33/035_          (2006.01)

(52) U.S. Cl.
CPC ............................... _G01R 33/0354_ (2013.01)

(58) Field of Classification Search
CPC ........................ G01R 33/00; G01R 33/0035; G01R 33/0023; G01R 33/0017; G01R 31/3191; G01R 33/0354; G01B 7/004; G01C 17/38; G06F 3/017; G06F 3/0346; G06F 3/012
See application file for complete search history.

(56) References Cited

U.S. PATENT DOCUMENTS

| | | | | |
|---|---|---|---|---|
| 7,135,701 | B2 * | 11/2006 | Amin ..................... | B82Y 10/00 |
| | | | | 365/162 |
| 10,847,573 | B1 * | 11/2020 | Berggren ............. | H10N 60/805 |
| 11,733,322 | B1 * | 8/2023 | Montoya ........... | G01R 33/0094 |
| | | | | 324/248 |
| 2020/0152854 | A1 * | 5/2020 | Sandberg ............... | H10N 60/83 |
| 2023/0016120 | A1 * | 1/2023 | Montoya ........... | G01R 33/0094 |

FOREIGN PATENT DOCUMENTS

| | | | | |
|---|---|---|---|---|
| EP | | 1884791 A1 * | 2/2008 | ........... G01R 33/035 |

OTHER PUBLICATIONS

Granata et al. (Granata) (Highly Sensitive Tunable Magnetometer Based on Superconducting Quantum Interference Device) (Year: 2023).*

* cited by examiner

*Primary Examiner* — Lee E Rodak
*Assistant Examiner* — Taqi R Nasir
(74) *Attorney, Agent, or Firm* — Naval Information Warfare Center, Pacific; Kyle Eppele; Paul C. Oestreich

(57)          ABSTRACT

A magnetic field detector includes a substrate, two or more Josephson junctions, and one or more heater elements. The two or more of Josephson junctions are connected to each other by superconducting interconnected paths via a superconducting material and are arranged in an array. The one or more heater elements directly or indirectly adjust the temperature of at least one Josephson junction via a tunable power source.

4 Claims, 12 Drawing Sheets

MAGNETIC FIELD DETECTOR

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor. Licensing and technical inquiries may be directed to the Office of Research and Technical Applications, Naval Information Warfare Center Pacific, Code 72120, San Diego, CA, 92152; (619) 553-5118; NIWC_Pacific_T2@us.navy.mil. Reference Navy Case Number 111478.

BACKGROUND

Magnetic field detectors are devices that sense magnetic fields or magnetic dipole moments. One example of a magnetic field detector is a Superconducting Quantum Interference Device (SQUID), which are one of the highest sensitivity types of magnetic field detectors. SQUIDs utilize a small loop of superconducting material with two weak links called Josephson Junctions (JJs) to sense the magnetic field. A SQUID array consists of a single circuit of many SQUID elements that are arranged in one, two, or three spatial dimensions. When a SQUID array consists of a non-linear distribution of SQUID elements, the circuit exhibits a voltage-flux transfer function with a single minimum, called the anti-peak, under an applied local magnetic field. SQUIDs have many uses, such as in magnetic property measurement systems (e.g., SQUID magnetometry), magnetic anomaly detectors, magnetic resonance imaging, or scanning SQUID microscopy.

DESCRIPTION OF THE DRAWINGS

Features and advantages of examples of the present disclosure will be apparent by reference to the following detailed description and drawings, in which like reference numerals correspond to similar, but in some instances, not identical, components. Reference numerals or features having a previously described function may or may not be described in connection with other drawings in which they appear.

DETAILED DESCRIPTION

Figure 1A:
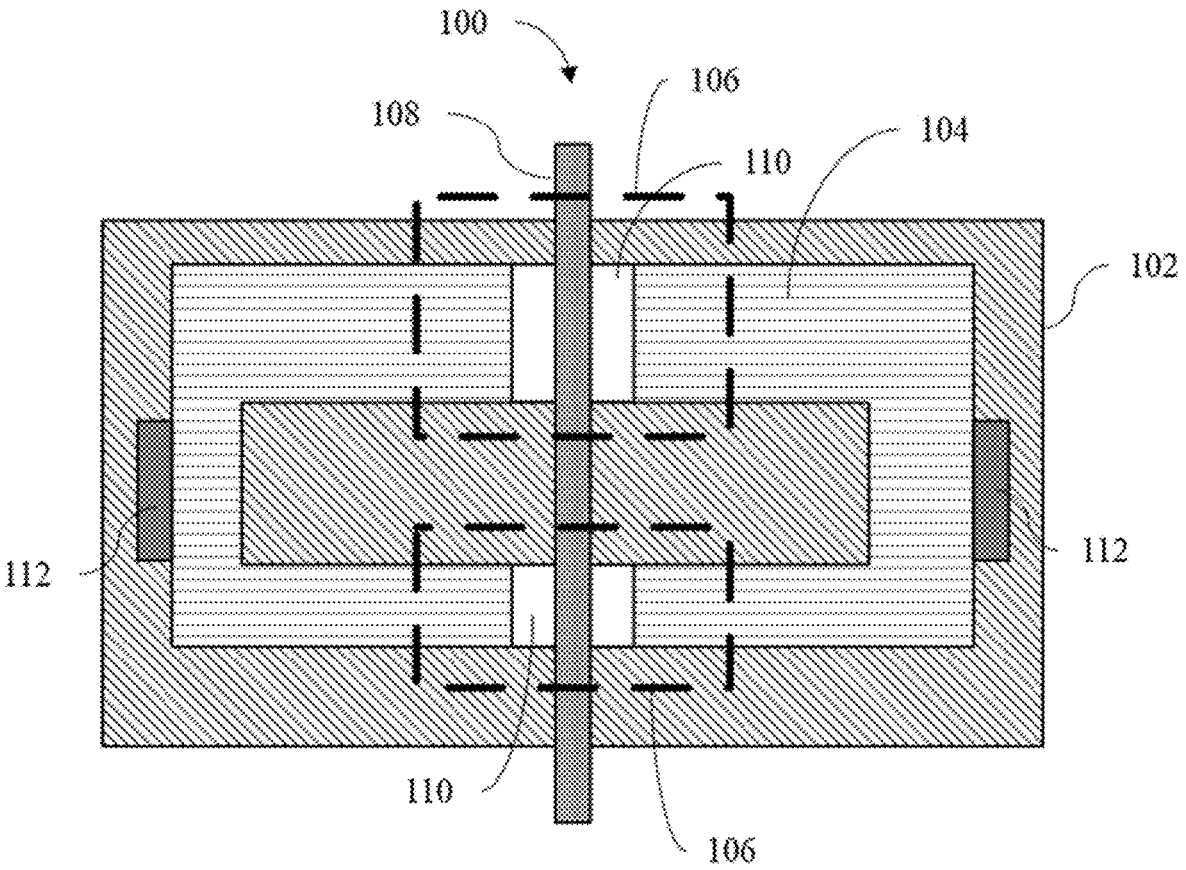
FIG. 1A-1C are a top view, side view, and another top view, respectively, of an example of a SQUID element with asymmetric Josephson junctions used in a magnetic field detector described herein.

A SQUID is a superconductor material loop containing at least one Josephson junction, which allows for the measurement of magnetic flux quanta when a magnetic field threads the superconducting loop. A SQUID array is a single superconducting circuit comprised of many (e.g., 10 to 1 million) individual SQUID elements that are connected in one, two, or three-dimensional configurations. In general, the temperature-dependent direct current (DC) and alternating current (AC) response of a SQUID or SQUID array depends on the superconductor material used to fabricate the SQUID elements, the tunnel barrier material which comprises the Josephson Junction (commonly an insulator), and the geometry configuration of the superconducting circuit (e.g. trace volume, loop area, tunnel barrier volume, etc.). Currently, a new SQUID or SQUID array has to be fabricated to adjust or optimize the DC and RF performance metrics for each application the SQUID or SQUID array is being used for or each platform the SQUID or SQUID array is being used in. Therefore, the fabrication of a new SQUID or SQUID array for each new application or a change in an existing application can result in a significant investment of time and resources.

A magnetic field detector is disclosed herein that is used for detecting direct current and alternating current magnetic fields. The magnetic field detector has one or more heater elements that are used on one or more SQUID elements. The heater elements contact all the tunnel barriers of the Josephson junctions on each SQUID element. The heater elements are also connected to a tunable power source. The tunable power source provides impedance tuning to the SQUID elements via the heater elements by tuning the power, which can adjust the temperature of the SQUID elements through the heater elements. Adjusting the local temperature reduces or eliminates mismatch losses that result from interfacing different circuits or electronics operating at different temperatures. In addition, the direct current (DC) and alternating current (AC) response of the SQUID elements can be tuned, which results in a higher sensitivity magnetic field sensor. As a result of the ability to tune the impedance, DC, or AC response, post-fabrication imperfections can be corrected without a need to fabricate a new magnetic field detector or repair the magnetic field detector. In addition, a new magnetic field detector does not need to be fabricated to adjust or optimize the DC and RF performance metrics for each application the magnetic field detector is being used for or each platform the magnetic field detector is being used in.

The magnetic field detector herein includes a substrate, two or more Josephson junctions, and one or more heater elements. The two or more of Josephson junctions are connected to each other by superconducting interconnected paths via a superconducting material and are arranged in an array. The one or more heater elements directly or indirectly adjust the temperature of at least one Josephson junction via a tunable power source.

Figure 1B:
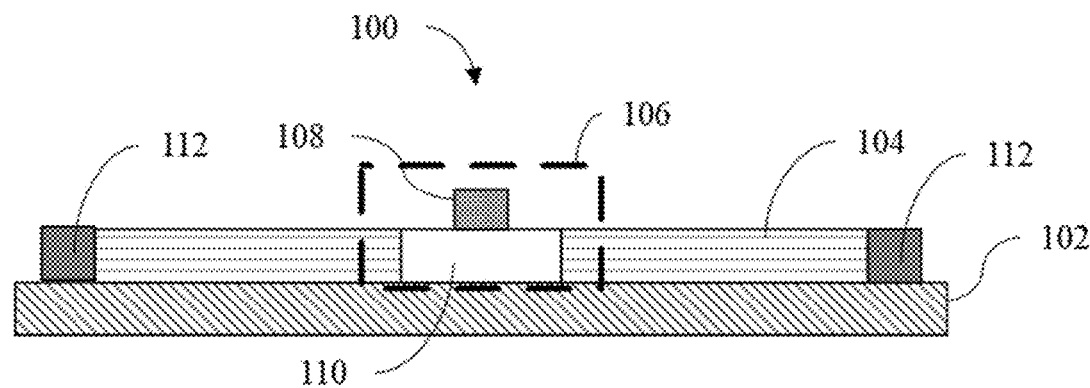

Referring now to FIG. 1A-1B, a top view and side view, respectively, of an example of a SQUID element with asymmetric Josephson junctions 100 used in a magnetic field detector is shown. The patterning in FIG. 1A-1B is for illustrative purposes only to aid in viewing and should not be construed as being limiting or directed to a particular material or materials. FIG. 1A-1B show an example of the SQUID element with asymmetric Josephson junctions 100 that includes the substrate 102 with a superconducting material 104 attached to the substrate 102. In this example, the superconducting material 104 has two asymmetric Josephson junctions 106. Each Josephson Junction 106 has a tunneling barrier 110. In this particular example, the heater element 108 directly contacts each tunneling barrier 110 of each Josephson junction 106 by contacting a top portion of the tunneling barrier 110. The heating element 108 contacts each tunneling barrier 110 by bisecting each Josephson junction 106. The SQUID element with asymmetric Josephson junctions 100 also includes two superconducting interconnecting paths 112 on each side of the superconducting material 104 that connect each SQUID element together. Each component of the SQUID element with asymmetric Josephson junctions 100 is discussed in detail below.

The substrate 102 may be any known substrate 102 that is used to synthesize thin-film or bulk superconductor materials. Some examples of the substrate material include crystalline materials, amorphous materials, or polycrystalline materials. Some specific examples of the substrate include MgO, $SrTiO_3$, $CaF_2$, $LaAlO_3$, $Al_2O_3$, $SrF_2$, $BaF_2$, $ZrO_2$, Si, or combinations thereof.

The superconducting material 104 affects the temperature-dependent direct current (DC) and alternating current (AC) response of a SQUID element or SQUID array in the magnetic field detector. Some examples of the superconducting material 104 include any low or high temperature superconducting material, such as a metal or metal alloy. Some examples include Nb, Al, YBCO, NbTi, NbN, NbGe, NbAl, NbCN, NbSn, and combinations thereof. The superconducting material 104 is the same material as the superconducting interconnecting paths 112 (discussed in detail below).

The two or more Josephson junctions 106 are connected to each other by superconducting interconnecting paths 112 where the two or more Josephson junctions 106 are arranged in an array. The two or more Josephson junctions 106 are organized into superconducting interference devices (SQUIDs) where each SQUID comprises two Josephson junctions connected to each other by the superconducting interconnecting path 112. Each Josephson junction 106 is positioned on the superconducting material 104 along the superconducting interconnected path 112. In the example in FIG. 1, the Josephson junctions 106 each include the tunneling barrier 110 and a portion of the heating element 108 that directly or indirectly contacts the tunneling barrier 110, which is shown by the dashed line rectangles. In the example in FIGS. 1A and 1B, the Josephson junctions 106 are centrally located on the superconducting material 104. In other examples, the Josephson junctions 106 may be located anywhere on the superconducting material 104 as long as the two Josephson junctions 106 are aligned and opposite each other for a heating element 108 to directly or indirectly contact both Josephson junctions 106.

The two or more Josephson junctions 106 form an array of Josephson Junctions when connected together. Some examples of an array of Josephson Junctions are at least three Josephson junctions connected in one, two, or three-dimensions. For example, a one-dimensional array includes two or more Josephson junctions connected in-series or parallel. A two-dimensional array includes two or more Josephson junctions connected in-series and parallel along an X-axis and Y-axis direction. A three-dimensional array could entail two or more Josephson junctions connected in-series, parallel, and stacked together in the Z-direction with other Josephson junctions connected in-series and parallel. Any type of one, two, or three-dimensional array may be used to connect the two or more Josephson junctions 106. Therefore, the magnetic field detector may have any number of Josephson junctions 106 arranged in any type of configuration.

In particular, the two or more Josephson junctions 106 may have symmetrical Josephson junctions, asymmetrical Josephson junctions, or a combination of both symmetrical and asymmetrical Josephson junctions. For example, the two or more Josephson junctions may have a width ranging from about 5 nanometers to about 100 micrometers. In an example, the width may vary within the array of Josephson junctions 106, as shown in FIG. 1 when the width is asymmetrical. When the width varies within the array of the two or more Josephson junctions 106, the width variation is equal to or less than 40% within the array. For example, if the largest Josephson junction width is about 1 micrometer, the smallest Josephson junction width is about 0.6 micrometer. In another example, the width is the same for the two or more Josephson junctions 106 within the array, when the width of the Josephson Junctions are symmetrical.

In another example, the two or more Josephson junctions 106 are organized into bi-superconducting quantum interference device (bi-SQUIDs). Each bi-SQUID includes two Josephson junctions 106 in a superconducting loop and a third Josephson junction 106 in a superconducting path that bisects the superconducting loop. At least one superconducting interconnecting path 112, that connects any two Josephson junctions 106, exhibits a volume-geometry difference relative to the remaining superconducting interconnecting paths 112 that connect remaining Josephson junctions 106 in an array. In other words, by modifying the thickness of the superconductor interconnecting material 112, the bi-SQUIDs can have asymmetric or symmetric Josephson junctions 106.

Similar to the superconducting material, the superconducting interconnecting paths 112 may be made of any low or high temperature superconducting material, such as a metal or metal alloy. Some examples include Nb, Al, YBCO, NbTi, NbN, NbGe, NbAl, NbCN, NbSn, and combinations thereof. When the magnetic field detector 100 includes an array of Josephson junctions 106, the superconducting interconnecting paths 112 form a three-dimensional grid array.

The three-dimensional grid array of the superconducting interconnecting paths 112 can be arranged uniformly or non-uniformly.

Figure 1C:
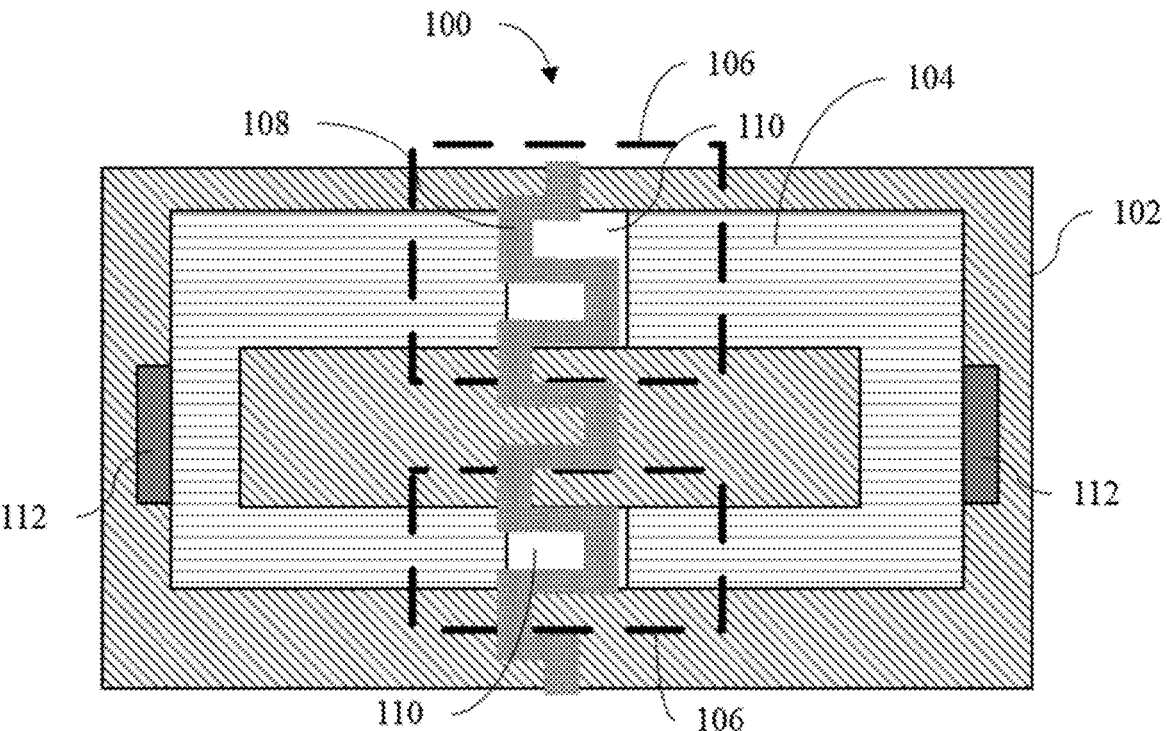

Referring back to FIG. 1A-1B, the SQUID element with asymmetric Josephson junctions 100 further includes one or more heater elements 108. The one or more heater elements 108 directly or indirectly adjusts the temperature of at least one Josephson junction 106 via a tunable power source. The tunable power source may be any tunable power source that can provide sufficient power to adjust the temperature of the magnetic field detector 100. The one or more heater elements 108 may be made of a metallic material, semi-metallic material, or a combination thereof. The one or more heater elements 108 may also be different shapes, such as a straight strip line, a meander strip line, or a combination thereof. In the example shown in FIG. 1A-1B, the heater element 108 is a straight strip line that directly contacts the top portion of the tunneling barrier 110 of each Josephson junctions 106. In FIG. 1C, an example of a heating element 108 with a meander strip line that directly contacts the top portion of the tunneling barrier 110 of each Josephson junctions 106. Additional examples of the one or more heater elements 108 are discussed in FIG. 2A-10B. FIG. 2A-10B have patterning for illustrative purposes only to aid in viewing and should not be construed as being limiting or directed to a particular material or materials. In addition, the examples in FIG. 2A-10B include all of the components are the same components as previously described herein for FIG. 1A-1B.

Figure 2A:
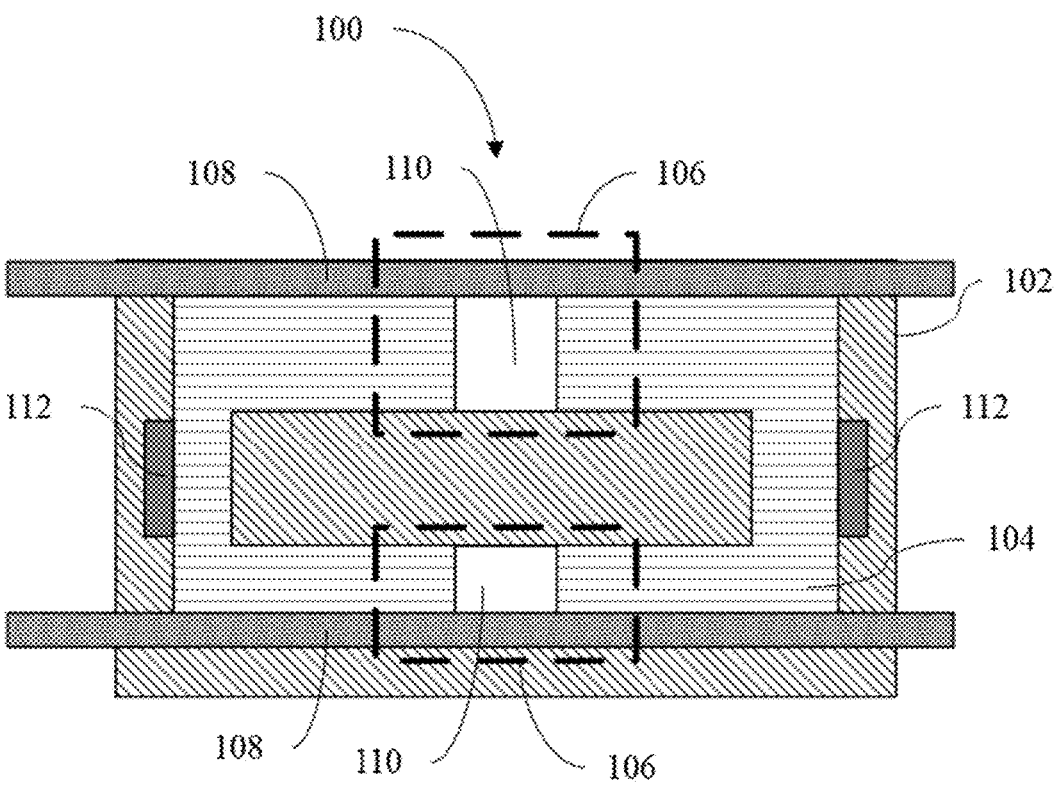
FIG. 2A-2B are a top view and side view, respectively, of another example of a SQUID element with asymmetric Josephson junctions used in a magnetic field detector described herein.
Figure 2B:
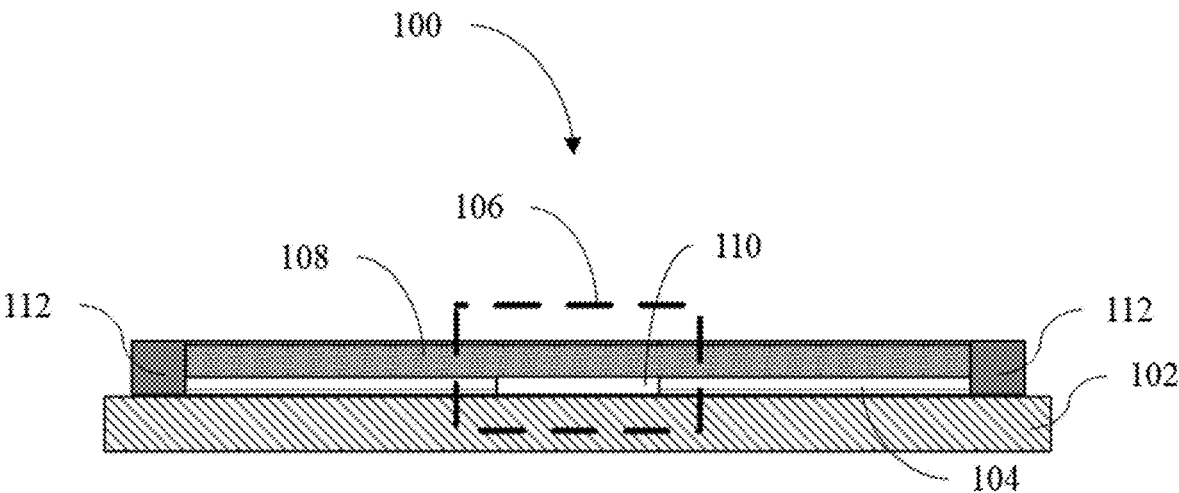

Referring now to FIG. 2A-2B, a top view and side view, respectively, of another example of a SQUID element with asymmetric Josephson junctions 100 used in a magnetic field detector is shown. FIG. 2A-2B show an example of the SQUID element with asymmetric Josephson junctions 100 that includes the substrate 102 with a superconducting material 104 attached to the substrate 102. In this example, the superconducting material 104 has two asymmetric Josephson junctions 106. Each Josephson Junction 106 has a tunneling barrier 110. However, in this example, the heater element 108 directly contacts a side portion of the tunneling barrier 110 by extending parallel to the tunneling barrier 110. The SQUID element with asymmetric Josephson junctions 100 also includes two superconducting interconnecting paths 112 on each side of the superconducting material 104 that connect each SQUID element together.

Figure 3A:
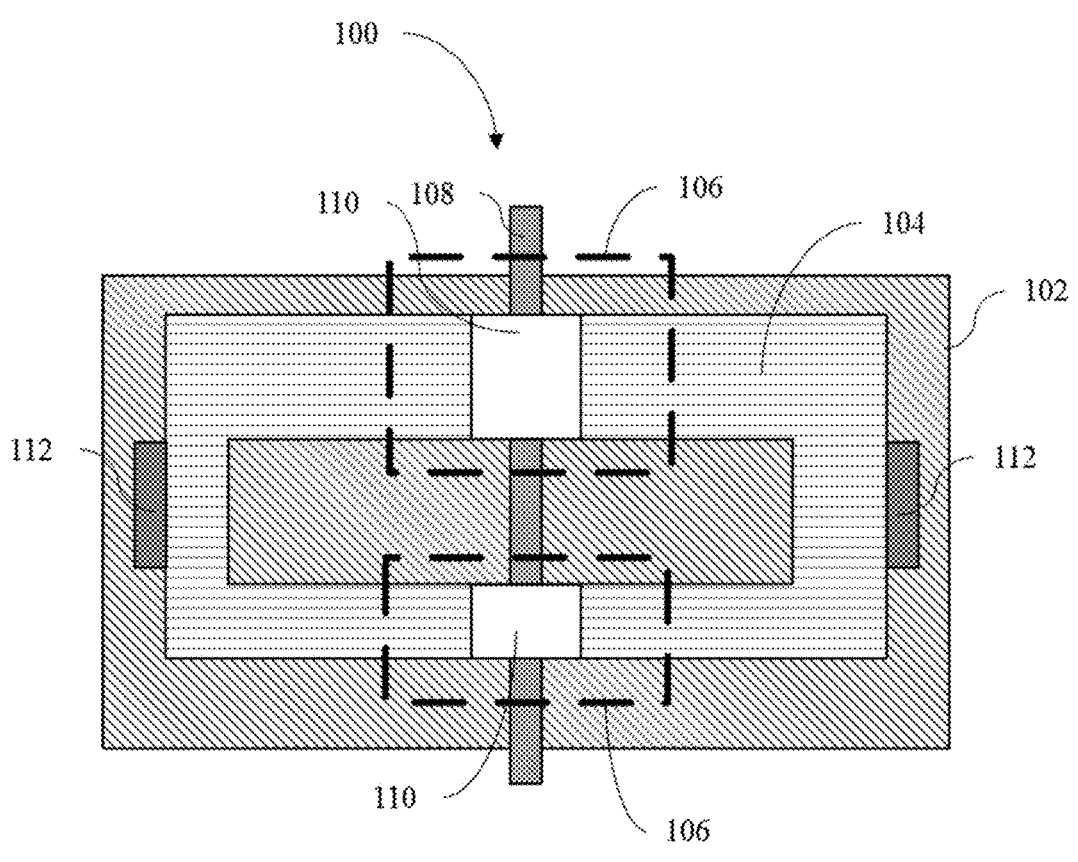
FIG. 3A-3B are a top view and side view, respectively, of another example of a SQUID element with asymmetric Josephson junctions used in a magnetic field detector described herein.
Figure 3B:
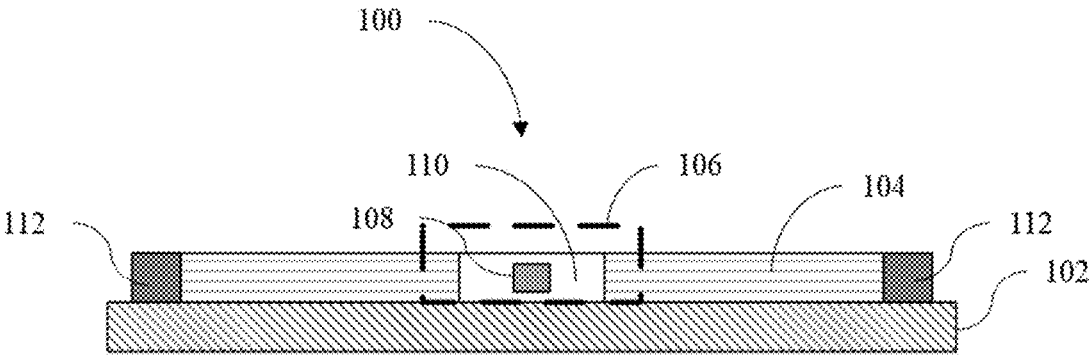

Referring now to FIG. 3A-3B, a top view and side view, respectively, of another example of a SQUID element with asymmetric Josephson junctions 100 used in a magnetic field detector is shown. FIG. 3A-3B show an example of the SQUID element with asymmetric Josephson junctions 100 that includes the substrate 102 with a superconducting material 104 attached to the substrate 102. In this example, the superconducting material 104 has two asymmetric Josephson junctions 106. Each Josephson Junction 106 has a tunneling barrier 110. This example includes the heater element 108 directly contacting the tunneling barrier 110 of at least one Josephson junction 106 as a straight strip line by extending through the tunneling barrier 110 and bisecting each Josephson junction 106. The SQUID element with asymmetric Josephson junctions 100 also includes two superconducting interconnecting paths 112 on each side of the superconducting material 104 that connect each SQUID element together.

Figure 4A:
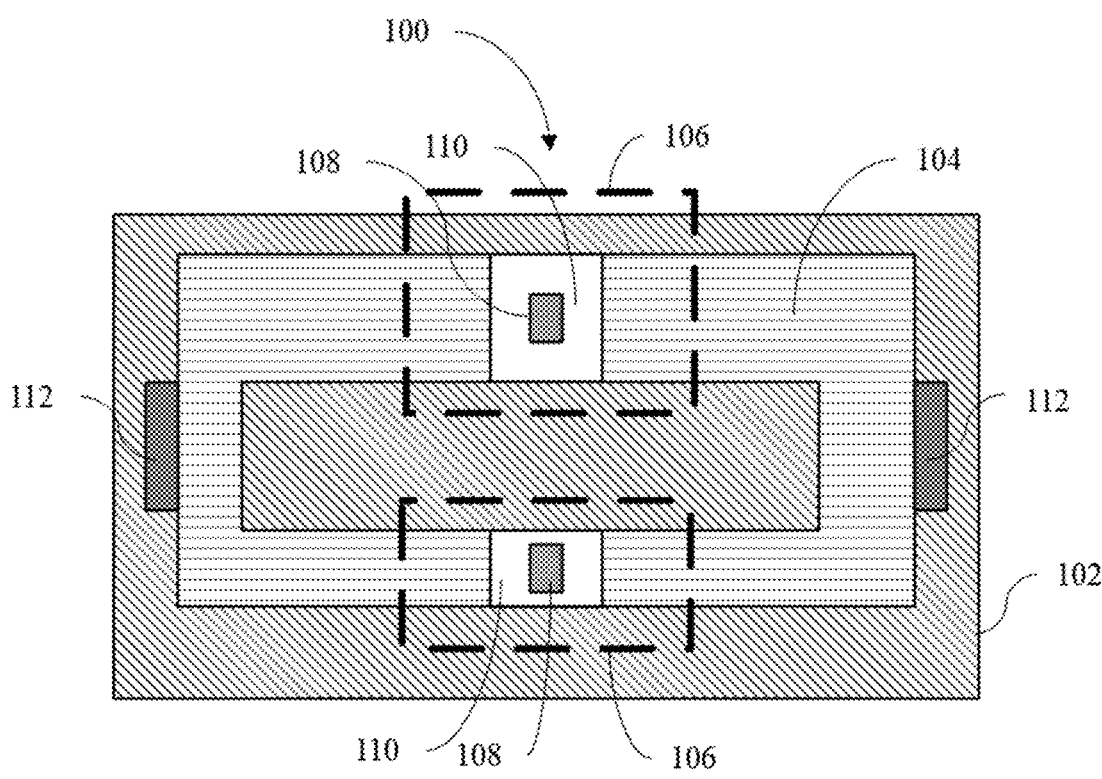
FIG. 4A-4B are a top view and side view, respectively, of another example of a SQUID element with asymmetric Josephson junctions used in a magnetic field detector described herein.
Figure 4B:
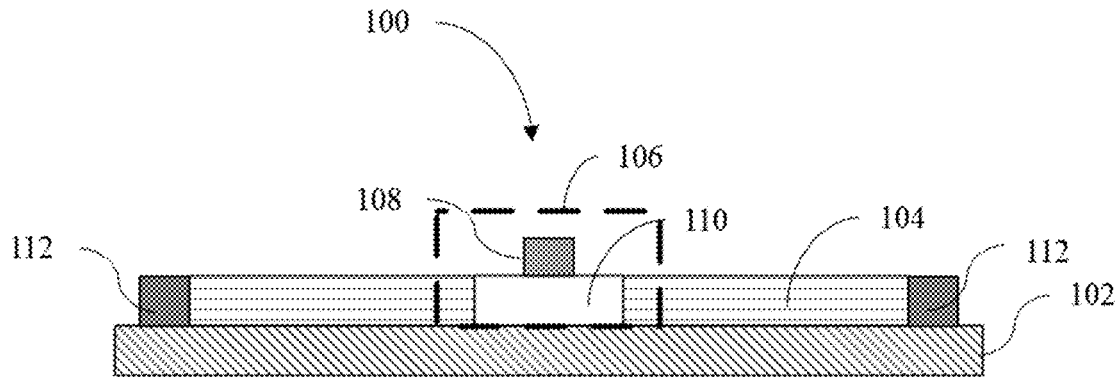

Referring now to FIG. 4A-4B a top view and side view, respectively, of another example of a SQUID element with asymmetric Josephson junctions 100 used in a magnetic field detector is shown. FIG. 4A-4B show an example of the SQUID element with asymmetric Josephson junctions 100 that includes the substrate 102 with a superconducting material 104 attached to the substrate 102. In this example, the superconducting material 104 has two asymmetric Josephson junctions 106. Each Josephson Junction 106 has a tunneling barrier 110. In this particular example, the heater element 108 directly contacts each tunneling barrier 110 of at least one Josephson junction 106 as a straight strip line by contacting a top portion of the tunneling barrier 110. In this example, there are two heater elements 108 where the two heater elements 108 are small strip line fragments centered on each tunneling barrier 110. The SQUID element with asymmetric Josephson junctions 100 also includes two superconducting interconnecting paths 112 on each side of the superconducting material 104 that connect each SQUID element together.

Figure 5A:
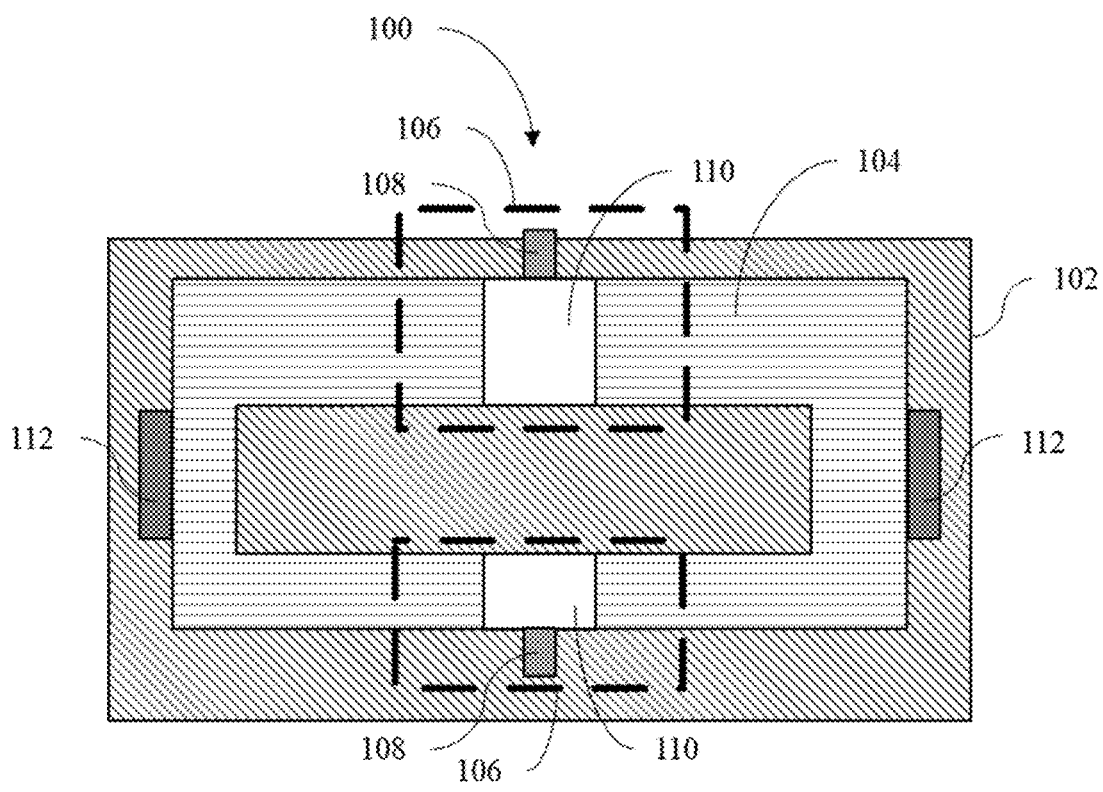
FIG. 5A-5B are a top view and side view, respectively, of another example a SQUID element with asymmetric Josephson junctions used in a magnetic field detector described herein.
Figure 5B:
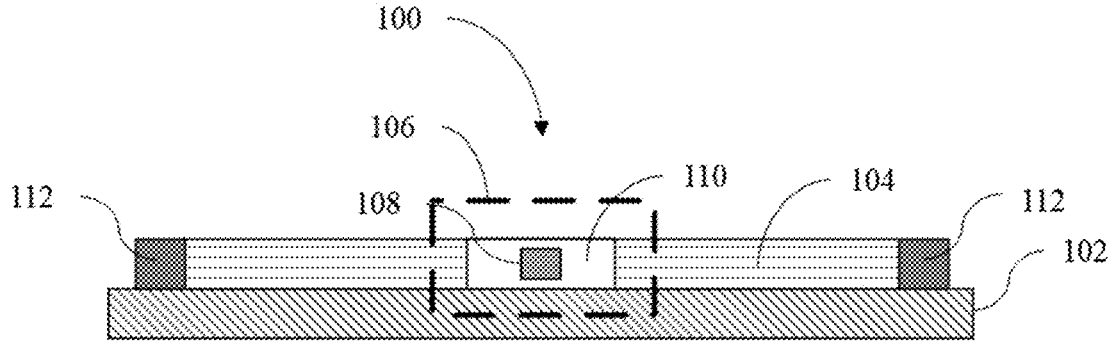

Referring to FIG. 5A-5B, a top view and side view, respectively, of another example of a SQUID element with asymmetric Josephson junctions 100 used in a magnetic field detector is shown. FIG. 5A-5B show an example of the SQUID element with asymmetric Josephson junctions 100 that includes the substrate 102 with a superconducting material 104 attached to the substrate 102. In this example, the superconducting material 104 has two asymmetric Josephson junctions 106. Each Josephson Junction 106 has a tunneling barrier 110. In this example, there are two heater elements 108 where the two heater elements 108 are small strip line fragments centered on each side portion of the tunneling barrier 110. The heater element 108 directly contact the tunneling barrier 110 of at least one Josephson junction 106 on each side by attaching the heater element 108 to the outer side of the tunneling barrier 110 of each Josephson junction 106. The SQUID element with asymmetric Josephson junctions 100 also includes two superconducting interconnecting paths 112 on each side of the superconducting material 104 that connect each SQUID element together.

Figure 6A:
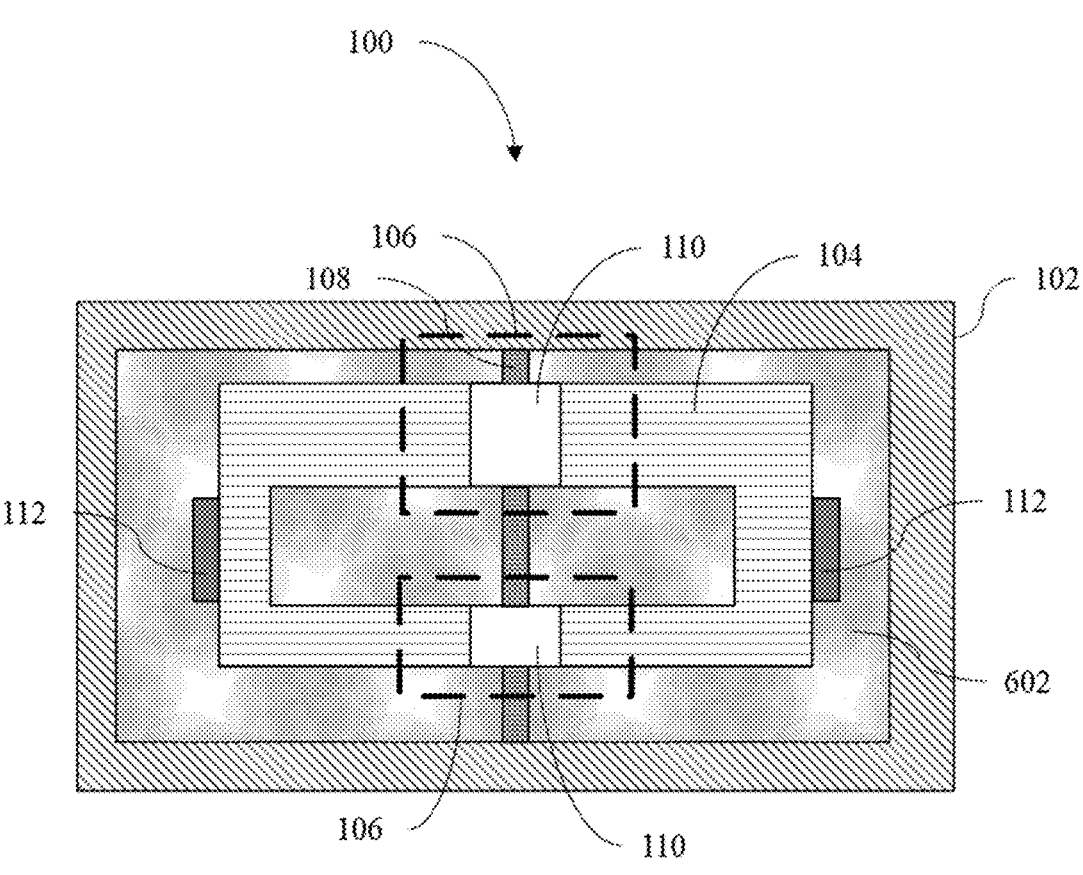
FIG. 6A-6B are a top view and side view, respectively, of another example of a SQUID element with asymmetric Josephson junctions used in a magnetic field detector described herein.
Figure 6B:
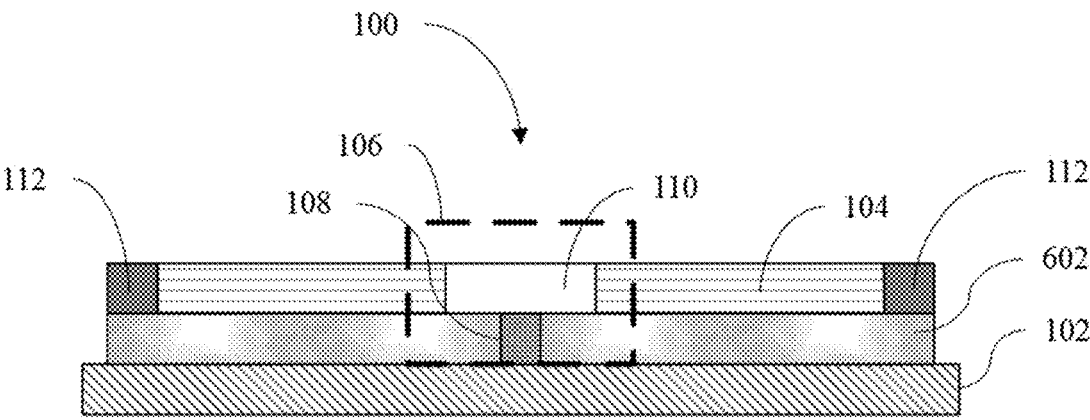

Referring not to FIG. 6A-6B, a top view and side view, respectively, of another example of a SQUID element with asymmetric Josephson junctions 100 used in a magnetic field detector is shown. FIG. 6A-6B show an example of the SQUID element with asymmetric Josephson junctions 100 that includes the substrate 102 with a superconducting material 104 attached to the substrate 102. In this example, the superconducting material 104 has two asymmetric Josephson junctions 106. Each Josephson Junction 106 has a tunneling barrier 110. In this example, the heater element 108 is embedded in a nonmagnetic, non-electrically conductive material 602. The nonmagnetic, non-electrically conductive material 602 is between the substrate 102 and the superconducting material 104, Josephson junctions 106, and superconducting interconnecting paths 112. As a result, in this example, the heater element 108 directly contacts the bottom portion of the tunneling barrier 110 as a straight strip line of at least one Josephson junction 106 by extending through the nonmagnetic material 602 to bisect each Josephson junction 106 and the nonmagnetic material 602. In other examples, the heater element 108 can indirectly contact the tunneling barrier 110 of at least one Josephson junction 106 if the heater element 108 was embedded in a portion of the nonmagnetic, non-electrically conductive material 602 that does not contact the tunneling barrier 110 of either Josephson junction 106. The SQUID element with asymmetric Josephson junctions 100 also includes two superconducting interconnecting paths 112 on each side of the superconducting material 104 that connect each SQUID element together.

Figure 7A:
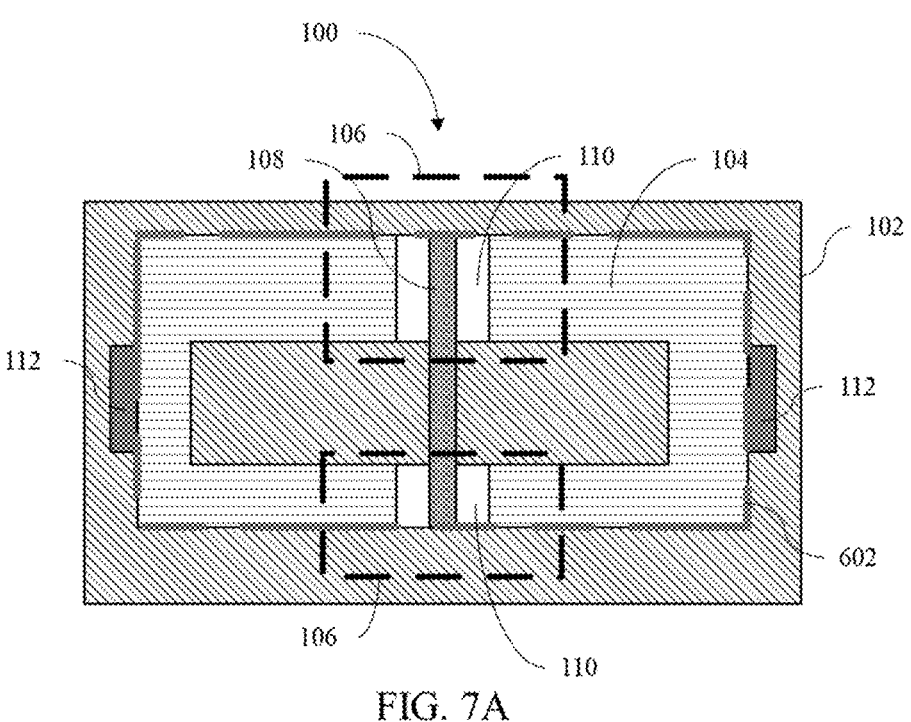
FIG. 7A-7C are a top view, side view, and cross-sectional view respectively, of another example of a SQUID element with asymmetric Josephson junctions used in a magnetic field detector described herein
Figure 7B:
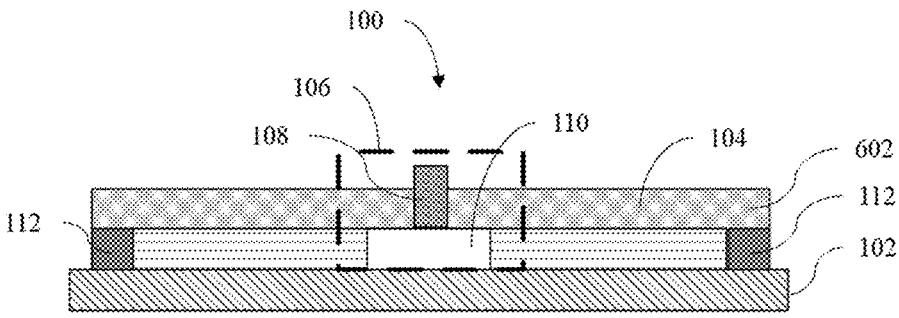
Figure 7C:
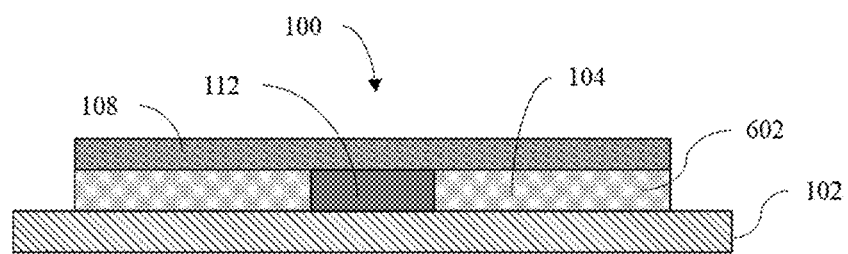

Referring now to FIG. 7A-7C, a top view, a side view, and a cross-sectional view, respectively, of another example of a SQUID element with asymmetric Josephson junctions 100 used in a magnetic field detector is shown. FIG. 7A-7C show an example of the SQUID element with asymmetric Josephson junctions 100 that includes the substrate 102 with a superconducting material 104 attached to the substrate 102. In this example, the superconducting material 104 has two asymmetric Josephson junctions 106. Each Josephson Junction 106 has a tunneling barrier 110. In this example, the heater element 108 is embedded in a nonmagnetic, non-electrically conductive material 602 as a straight strip line. However, in FIG. 7A-7C, the nonmagnetic, non-electrically conductive material 602 is on top of the superconducting material 104, Josephson junctions 106, and superconducting interconnecting paths 112. As a result, in this example, the heater element 108 directly contacts the top portion of the tunneling barrier 110 of at least one Josephson junction 106 by extending through the nonmagnetic, non-electrically conductive material 602 to bisect each Josephson junction 106 and the nonmagnetic, non-electrically conductive material 602. In other examples, the heater element 108 can indirectly contact the tunneling barrier 110 of at least one Josephson junction 106 if the heater element 108 was embedded in a portion of the nonmagnetic, non-electrically conductive material 602 that does not contact the tunneling barrier 110 of either Josephson junction 106. The SQUID element with asymmetric Josephson junctions 100 also includes two superconducting interconnecting paths 112 on each side of the superconducting material 104 that connect each SQUID element together.

Figure 8A:
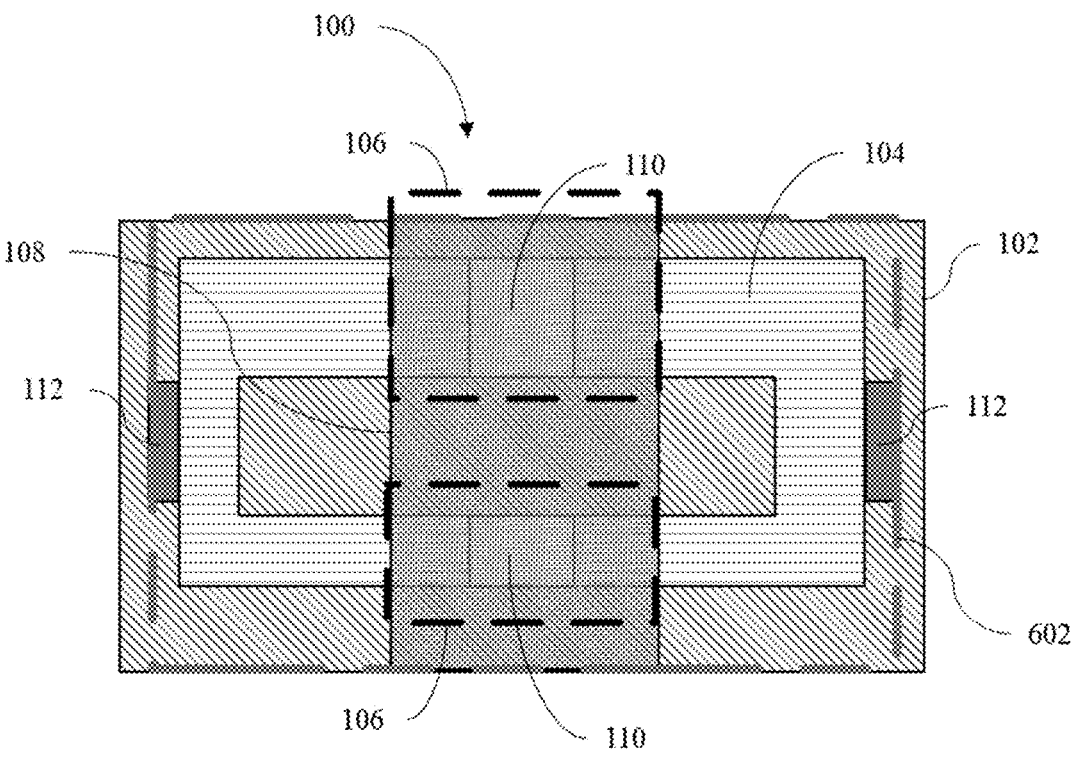
FIG. 8A-8B are a top view and side view, respectively, of another example of a SQUID element with asymmetric Josephson junctions used in a magnetic field detector described herein
Figure 8B:
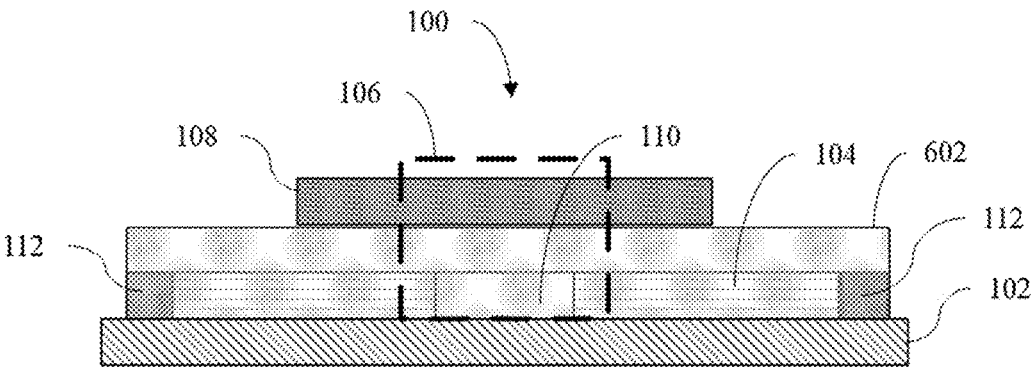

Referring now to FIG. 8A-8B, a top view and side view, respectively, of another example of a SQUID element with asymmetric Josephson junctions 100 used in a magnetic field detector is shown. FIG. 8A-8B show an example of the SQUID element with asymmetric Josephson junctions 100 that includes the substrate 102 with a superconducting material 104 attached to the substrate 102. In this example, the superconducting material 104 has two asymmetric Josephson junctions 106. Each Josephson Junction 106 has a tunneling barrier 110. In this example, the heater element 108 is attached to the top portion of a nonmagnetic, non-electrically conductive material 602. The nonmagnetic, non-electrically conductive material 602 embeds the superconducting material 104, Josephson junctions 106, and superconducting interconnecting paths 112 as shown in FIG. 8B. As a result, the heater element 108 indirectly contacts the tunneling barrier 110 of at least one Josephson junction 106 through the nonmagnetic, non-electrically conductive material 602. The SQUID element with asymmetric Josephson junctions 100 also includes two superconducting interconnecting paths 112 on each side of the superconducting material 104 that connect each SQUID element together.

Figure 9A:
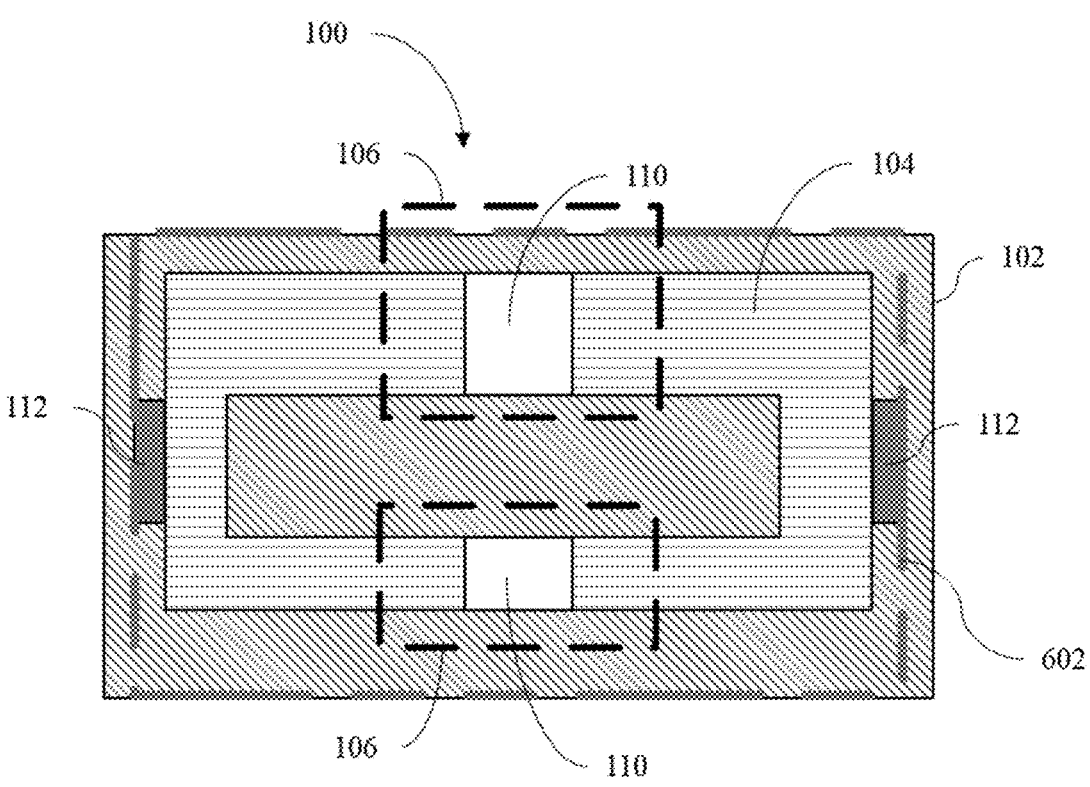
FIG. 9A-9B are a top view and side view, respectively, of another example of a SQUID element with asymmetric Josephson junctions used in a magnetic field detector described herein.
Figure 9B:
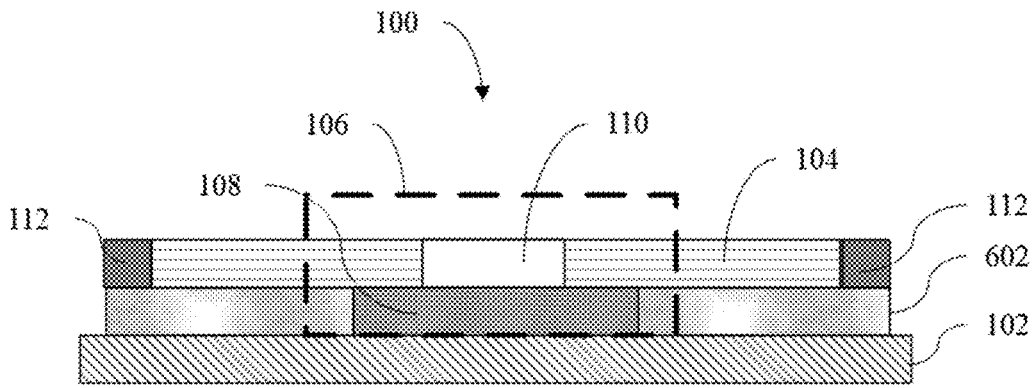

Referring now to FIG. 9A-9B, a top view and side view, respectively, of another example of a SQUID element with asymmetric Josephson junctions 100 used in a magnetic field detector is shown. FIG. 9A-9B show an example of the SQUID element with asymmetric Josephson junctions 100 that includes the substrate 102 with a superconducting material 104 attached to the substrate 102. In this example, the superconducting material 104 has two asymmetric Josephson junctions 106. Each Josephson Junction 106 has a tunneling barrier 110. In this example, the heater element 108 is embedded in a nonmagnetic, non-electrically conductive material 602. However, in FIG. 9A-9B, the nonmagnetic, non-electrically conductive material 602 is between the superconducting material 104, Josephson junctions 106, and superconducting interconnecting paths 112 and the substrate 102. As a result, in this example, the heater element 108 directly contacts the bottom portion of the tunneling barrier 110 of at least one Josephson junction 106 by extending through the nonmagnetic, non-electrically conductive material 602 to bisect each Josephson junction 106 and the nonmagnetic, non-electrically conductive material 602. In other examples, the heater element 108 can indirectly contact the tunneling barrier 110 of at least one Josephson junction 106 if the heater element 108 was embedded in a portion of the nonmagnetic, non-electrically conductive material 602 that does not contact the tunneling barrier 110 of either Josephson junction 106. The SQUID element with asymmetric Josephson junctions 100 also includes two superconducting interconnecting paths 112 on each side of the superconducting material 104 that connect each SQUID element together.

Figure 10A:
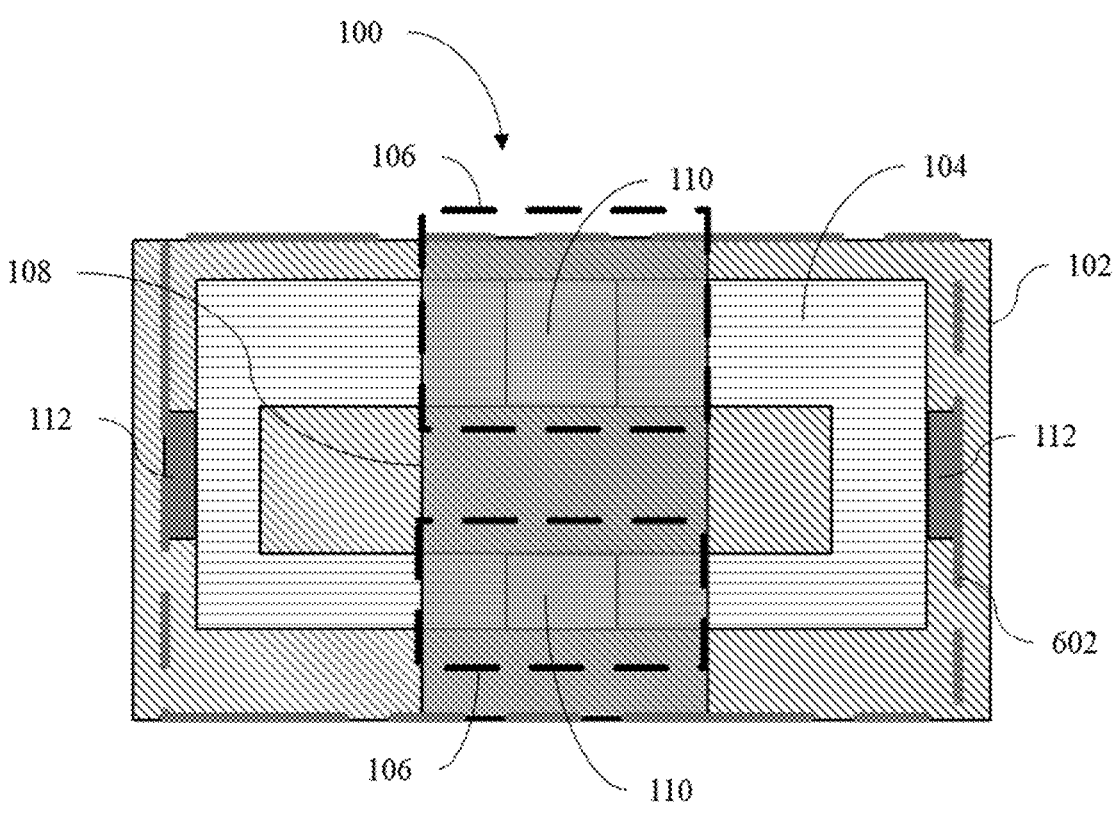
FIG. 10A-10B are a top view and side view, respectively, of another example of a SQUID element with asymmetric Josephson junctions used in a magnetic field detector described herein.
Figure 10B:
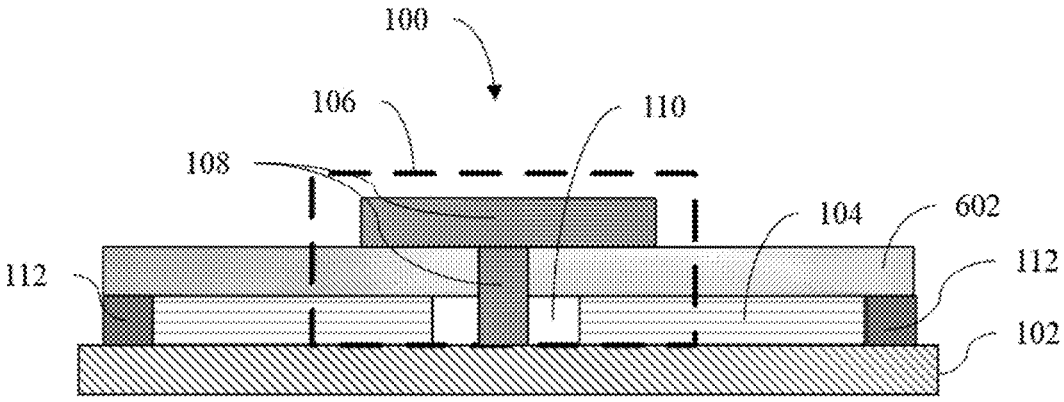

Referring now to FIG. 10A-10B, a top view and side view, respectively, of another example of a SQUID element with asymmetric Josephson junctions 100 used in a magnetic field detector is shown. FIG. 10A-10B show an example of the SQUID element with asymmetric Josephson junctions 100 that includes the substrate 102 with a superconducting material 104 attached to the substrate 102. In this example, the superconducting material 104 has two asymmetric Josephson junctions 106. Each Josephson Junction 106 has a tunneling barrier 110. In this example, the heater element 108 is on top of and embedded in a nonmagnetic, non-electrically conductive material 602. In FIG. 10A-10B, the nonmagnetic, non-electrically conductive material 602 is on top of the superconducting material 104, Josephson junctions 106, and superconducting interconnecting paths 112. As a result, in this example, the heater element 108 directly contacts the top portion of the tunneling barrier 110 of at least one Josephson junction 106 by extending above and into the nonmagnetic, non-electrically conductive material 602. In other examples, the heater element 108 can indirectly contact the tunneling barrier 110 of at least one Josephson junction 106 if the heater element 108 extends into a portion of the nonmagnetic, non-electrically conductive material 602 that does not contact the tunneling barrier 110 of either Josephson junction 106. The SQUID element with asymmetric Josephson junctions 100 also includes two superconducting interconnecting paths 112 on each side of the superconducting material 104 that connect each SQUID element together.

Figure 11A:
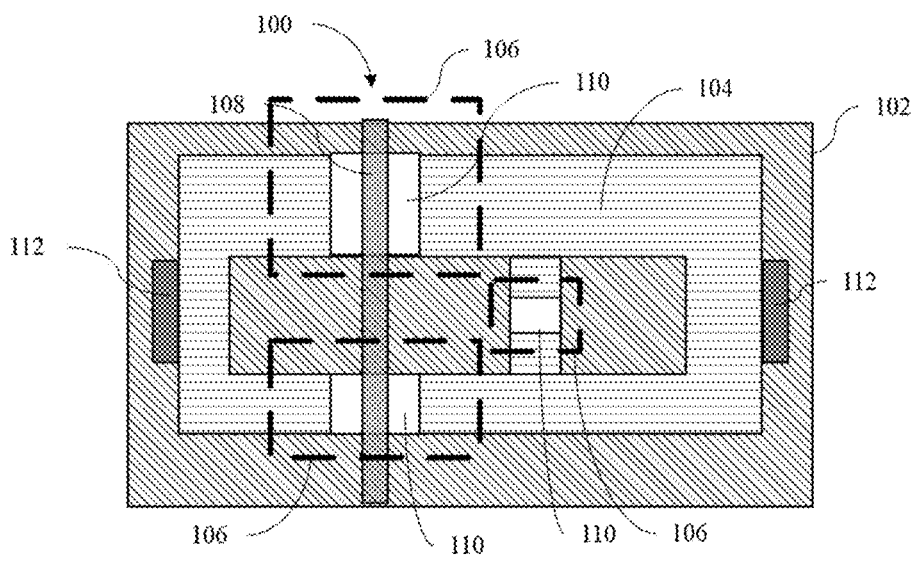
FIG. 11A-11C are a top view, a side view, and another top view, respectively, of an example of a bi-superconducting quantum interference device (bi-SQUID) element with asymmetric Josephson junctions used in a magnetic field detector described herein.
Figure 11B:
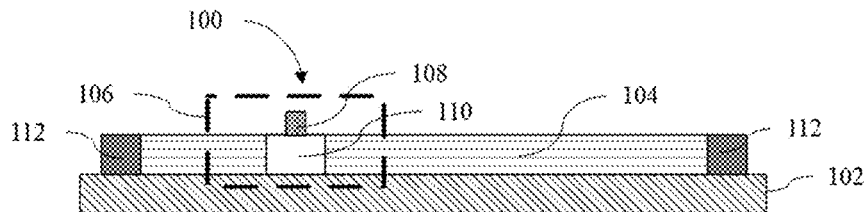
Figure 11C:
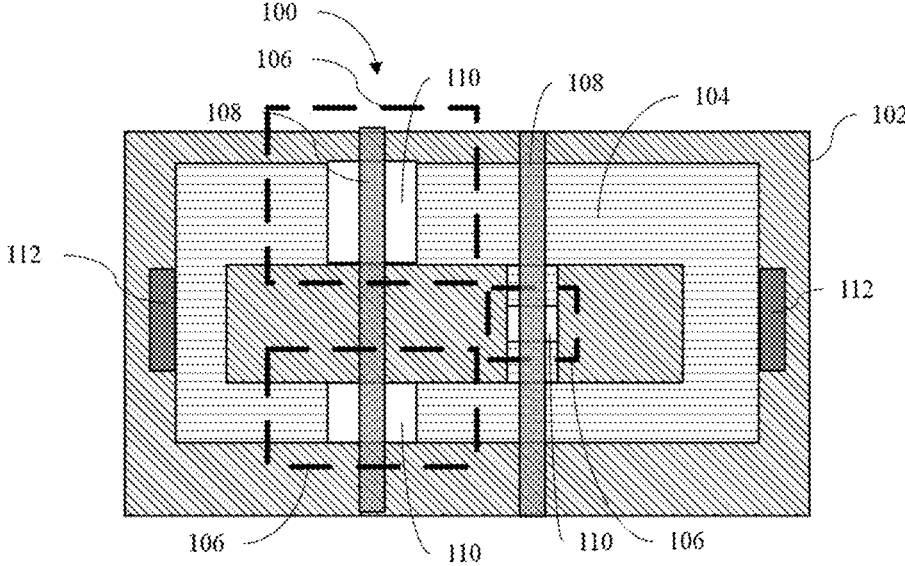

Referring now to FIG. 11A-11C, a top view, a side view, and a top view of another example, respectively, of a bi-SQUID element with asymmetric Josephson junctions used in a magnetic field detector is shown. FIG. 11A-11B show an example of the bi-SQUID element with asymmetric Josephson junctions 100 that includes the substrate 102 with a superconducting material 104 attached to the substrate 102. In this example, the superconducting material 104 has three asymmetric Josephson junctions 106. Each Josephson Junction 106 has a tunneling barrier 110. In the example shown in FIG. 11A and FIG. 11B, the heater element 108 directly contacts the top portion of the tunneling barrier 110 of each Josephson junction 106 the heater element 108 passes over. In the example shown in FIG. 11C, there are two heater elements 108 where one heater element 108 directly contacts the top portion of the tunneling barrier 110 of two Josephson junctions 106 and the second heater element 108 directly contacts the top portion of the tunneling barrier 110 of an individual Josephson junction 106. The SQUID element with asymmetric Josephson junctions 100 also includes two superconducting interconnecting paths 112 on each side of the superconducting material 104 that connect each SQUID element together.

A superconducting quantum interference system is also disclosed herein. The superconducting quantum interference system includes a substrate, a grid of superconducting interconnecting paths, a plurality of superconducting quantum interference device (SQUIDs), and one or more heater elements. The substrate, the grid of superconducting interconnecting paths, the plurality of SQUIDs, and the one or more heater elements are the same substrate, the grid of superconducting interconnecting paths, the plurality of SQUIDs, and the one or more heater elements as previously described herein. The plurality of SQUIDs are arranged in a two-dimensional array on the grid of superconducting interconnecting paths. The superconducting interconnecting paths connect the plurality of SQUIDs to each other. The one or more heater elements include at least one section of the plurality of SQUIDS that have at least one individual heater element that directly or indirectly adjusts the temperature of at least one SQUID via a tunable power source. The individual heater elements adjust the temperature of the section of the plurality of SQUIDs via an independent and tunable power source.

As used herein, the term "about" is used to provide flexibility to a numerical range endpoint by providing that a given value may be "a little above" or "a little below" the endpoint. The degree of flexibility of this term can be dictated by the particular variable and would be within the knowledge of those skilled in the art to determine based on experience and the associated description herein.

As used herein, a plurality of items, structural elements, compositional elements, and/or materials may be presented in a common list for convenience. However, these lists should be construed as though each member of the list is individually identified as a separate and unique member. Thus, no individual member of a list should be construed as a de facto equivalent of any other member of the same list merely based on their presentation in a common group without indications to the contrary.

Unless otherwise stated, any feature described herein can be combined with any aspect or any other feature described herein.

Reference throughout the specification to "one example", "another example", "an example", means that a particular element (e.g., feature, structure, and/or characteristic)

described in connection with the example is included in at least one example described herein, and may or may not be present in other examples. In addition, the described elements for any example may be combined in any suitable manner in the various examples unless the context clearly dictates otherwise.

In describing and claiming the examples disclosed herein, the singular forms "a", "an", and "the" include plural referents unless the context clearly dictates otherwise.

What is claimed is:

1. A magnetic field detector, comprising:
a substrate;
two asymmetrical Josephson junctions disposed on the substrate, both asymmetrical Josephson junctions having a tunneling barrier formed of an insulating material bisecting a superconducting material;
a heater element in direct physical contact with each tunneling barrier, the heater element comprising a strip line or meander strip disposed on the tunneling barriers; and
wherein a first of the two asymmetrical Josephson junctions has a tunneling barrier width greater than a tunneling barrier width of a second of the two asymmetrical Josephson junctions, wherein the difference in width is up to 40%.

2. The magnetic field detector according to claim 1, further comprising a superconducting interconnecting path connected to the superconducting material of each of the two asymmetrical Josephson junctions and forming a superconducting quantum interference device (SQUID):
wherein the first and second heater elements each comprise a pair of strip lines contacting opposed outer edges of the respective tunneling barriers.

3. The magnetic field detector according to claim 1, wherein the substrate is comprised of a material selected from the group consisting of: MgO, $SrTiO_3$, $CaF_2$, $LaAlO_3$, $Al_2O_3$, $SrF_2$, $BaF_2$, $ZrO_2$, and Si.

4. The magnetic field detector according to claim 1, wherein the superconducting material is selected from the group consisting of: Nb, Al, YBCO, NbTi, NbN, NbGe, NbAl, NbCN, and NbSn.

* * * * *